(12) United States Patent  
Qian

(10) Patent No.: US 7,935,186 B2
(45) Date of Patent: May 3, 2011

(54) PLASMA PROCESSING APPARATUS

(75) Inventor: Qing Qian, San Jose, CA (US)

(73) Assignee: Advanced Micro-Fabrication Equipment, Inc. Asia, George Town, Grand Cayman (KY)

( * ) Notice: Subject to any disclaimer, the term of this patent is extended or adjusted under 35 U.S.C. 154(b) by 1239 days.

(21) Appl. No.: 11/441,290

(22) Filed: May 24, 2006

(65) Prior Publication Data

US 2007/0028840 A1 Feb. 8, 2007

(30) Foreign Application Priority Data

Aug. 5, 2005 (CN) .......................... 2005 1 0028567

(51) Int. Cl.
C23C 16/00 (2006.01)
C23F 1/00 (2006.01)
H01L 21/306 (2006.01)

(52) U.S. Cl. .................... 118/719; 118/723 E; 118/733; 156/345.31; 156/345.47

(58) Field of Classification Search .................. 118/719; 156/345.31, 345.32; 414/939
See application file for complete search history.

(56) References Cited

U.S. PATENT DOCUMENTS

| 4,764,076 | A | * | 8/1988 | Layman et al. ................ 414/217 |
| 5,382,126 | A | * | 1/1995 | Hartig et al. .................. 414/217 |
| 5,639,309 | A | * | 6/1997 | Akimoto ................ 118/723 MP |
| 5,667,592 | A | * | 9/1997 | Boitnott et al. ................ 118/719 |
| 5,811,022 | A | | 9/1998 | Savas et al. |
| 5,855,681 | A | | 1/1999 | Maydan et al. |
| 6,962,644 | B2 | | 11/2005 | Paterson et al. |
| 2003/0230385 | A1 | * | 12/2003 | Bach et al. ................ 156/345.49 |
| 2005/0133163 | A1 | | 6/2005 | Shannon et al. |
| 2005/0247265 | A1 | * | 11/2005 | Devine et al. ................. 118/719 |
| 2007/0030091 | A1 | | 2/2007 | Xia |

FOREIGN PATENT DOCUMENTS

| CN | 1909184 A | 2/2007 |
| CN | 1909185 A | 2/2007 |
| CN | 1948550 A | 4/2007 |

OTHER PUBLICATIONS

Office Action for Chinese Patent Application No. 200710042285.5 dated Nov. 21, 2007.

* cited by examiner

Primary Examiner — Karla Moore
(74) Attorney, Agent, or Firm — Nixon Peabody LLP.; Joseph Bach, Esq.

(57) ABSTRACT

A plasma processing apparatus is described and which includes a chamber having at least two processing stations which are separated by a wall. At least one channel is formed in the wall, and wherein the channel has a width to length ratio of less than about 1:3.

10 Claims, 8 Drawing Sheets

PLASMA PROCESSING APPARATUS

RELATED PATENT DATA

The present application claims priority from Chinese Patent Application Serial No. 200510028567.0, and which was filed on Aug. 5, 2005.

TECHNICAL FIELD

The present invention relates to a plasma processing apparatus which is useful in the manufacture of semiconductor or integrated circuits, and more specifically to a plasma processing apparatus that can process multiple semiconductor work pieces substantially simultaneously.

BACKGROUND OF THE INVENTION

In the fabrication of semiconductor work pieces or other integrated circuits, two types of semiconductor processing systems are commonly employed. The first type of system which is commonly used relates to a batch processing system. Further, the other type of system which is used is employed with only single semiconductor work pieces. While those skilled in the art have long recognized that single work piece processing systems have many advantages, such as providing uniformity of production, it has many shortcomings as well. Chief among these shortcomings is that it is often difficult to achieve uniform heating between each work piece. Additionally, the processing speeds of such assemblies, coupled with a slow throughput and high overhead operating costs, are typically severe limitations which have detracted from the widespread adoption and use of such assemblies.

In the prior art batch processing systems which have been used, heretofore, semiconductor work pieces are typically placed either in a horizontal or vertical orientation relative to a carrier and are then placed in a processing chamber for appropriate processing. For example, in U.S. Pat. No. 5,855,681, several batch processing apparatuses for semiconductor work pieces are shown and described and which have a polygonal or round processing chamber containing multiple work stations, each work station holds one semiconductor work piece. The teachings of this patent are incorporated by reference, herein.

To ensure uniformity of production, it is well known that the processing conditions for each of the semiconductor work pieces needs to be substantially identical. Batch processing systems utilized, heretofore, have been designed in a fashion whereby each of the processing stations share many of the same pieces of equipment and resources provided by the apparatus. For example, such batch processing systems commonly have a common heating apparatus; gas source; inlet/exhaust apparatus; plasma generators and the like. It has been found that this shared arrangement of various assemblies inevitably causes non-uniform processing of the semiconductor work pieces. As should be understood, in the processing of semiconductor work pieces employing plasma having active particles which are energized by RF energy, the manufacturing procedure for the deposition or etching of a semiconductor work piece to gain uniformity in production is considered much more rigorous. Heretofore, to achieve uniformity of production utilizing plasma processing, much research activity has been directed towards controlling the gas pressure and the inputted RF energy. While controlling the uniformity of the RF energy input is a relatively easy task, achieving uniformity of gas pressure inside a processing chamber has proven to be more difficult endeavor.

In this regard, to achieve uniformity of gas pressure inside a plasma processing chamber, two solutions have been employed. The first solution has been to isolate the processing stations in the processing chamber. When this approach is used, the manufacture of the chamber becomes a more difficult task inasmuch as the respective processing stations must be as structurally identical as possible. Still further, the respective gas and electric input devices similarly need to be as closely similar or substantially identical. However, and as will be readily recognized, due to machining errors which inevitably occur in the fabrication of the processing chamber, or further, as wear and tear on the machine occurs, different processing conditions between the respective processing stations begin to emerge.

Therefore, it should be clear that this approach can hardly insure strict uniformity of the resulting plasma processing of the semiconductor work pieces in the same batch. Another prior art measure which has been employed from time-to-time is to couple the respective processing stations in fluid flowing relation one relative to the other. In this arrangement, the gas pressure between the respective processing stations can be maintained and the distribution of neutral particles within the plasma is maintained. However, because the processing chamber is not sealed, charged particles will often be shared between the processing regions and interfere with each other. This sharing of charged particles has the effect of disturbing the electrical fields in the respective processing stations and thus deteriorates the uniformity of the resulting semiconductor work pieces provided by the respective plasma processing chambers.

Therefore, a plasma processing apparatus which avoids the shortcomings attendant with the prior art apparatus and methodology utilized heretofore is the subject matter of the present application.

SUMMARY OF THE INVENTION

A first aspect of the present invention relates to a plasma processing apparatus which includes a chamber defining at least two processing stations; and a wall positioned in the chamber and separating the two processing stations, and wherein the wall defines a channel which couples the two processing stations in fluid flowing relation, and wherein the channel has a width to length ratio of less than about 1:3.

Another aspect of the present invention relates to a plasma processing apparatus which includes a chamber defining at least two processing stations and which are separated from each other by a wall, and wherein the wall defines an opening which couples the two processing stations in fluid flowing relation one relative to the other; and a member borne by the wall and selectively moveable so as to selectively occlude the opening so as to adjust a width to length ratio of the opening to less than about 1:3.

Yet another aspect of the present invention relates to a plasma processing apparatus which includes at least one chamber defining at least two processing regions which are respectively separated from each other by a wall, and wherein the wall defines an opening which couples the respective processing regions in fluid flowing relation; and a protection assembly located within at least one of the two processing stations and which is selectively moveable along the wall which separates the at least two processing stations, and wherein the protection assembly defines a channel which extends therethrough, and which has a width to length ratio of less than about 1:3.

Finally, the present invention relates to a plasma processing apparatus which includes a processing chamber having an exterior wall, an interior wall, and top and bottom surfaces which are mounted on the exterior wall, and wherein the processing chamber and interior wall define at least two internal processing stations, and wherein the exterior wall defines individual transfer ports which facilitate the movement of a semiconductor work piece into, and out of, the respective processing stations, and wherein an opening is defined between the top surface of the processing chamber, and the interior wall, and which couples the respective processing chambers in fluid flowing relation, one relative to the other; a grounding ring mounted on the top surface of the processing chamber, and within each of the processing stations, and wherein a gap is defined between each of the grounding rings and the interior wall, and the opening is adjacent to each of the grounding rings; a first electrode mounted on the top surface of the processing chamber, and within each of the processing stations, and wherein the grounding ring surrounds the respective first electrodes; a second electrode mounted on the bottom surface of the processing chamber, and within each of the processing stations; a protection assembly positioned within each of the processing stations, and moveable relative to the interior and exterior walls of the processing chamber, and within the gap defined between each of the grounding rings and the interior wall from a first position, wherein the protection assembly blocks the respective transfer ports, to a second position where the respective transfer ports are open, and wherein the protection assembly further defines a channel which selectively couples the respective processing stations in fluid flowing relation, one relative to the other, and wherein the channel has a width to length ratio of less than about 1:3.

These and other aspects of the present invention will be discussed in greater detail hereinafter.

BRIEF DESCRIPTION OF THE DRAWINGS

Preferred embodiments of the invention are described below with reference to the following accompanying drawings.

FIG. 3 is a greatly simplified, fragmentary, schematic diagram of one embodiment of the plasma processing apparatus of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
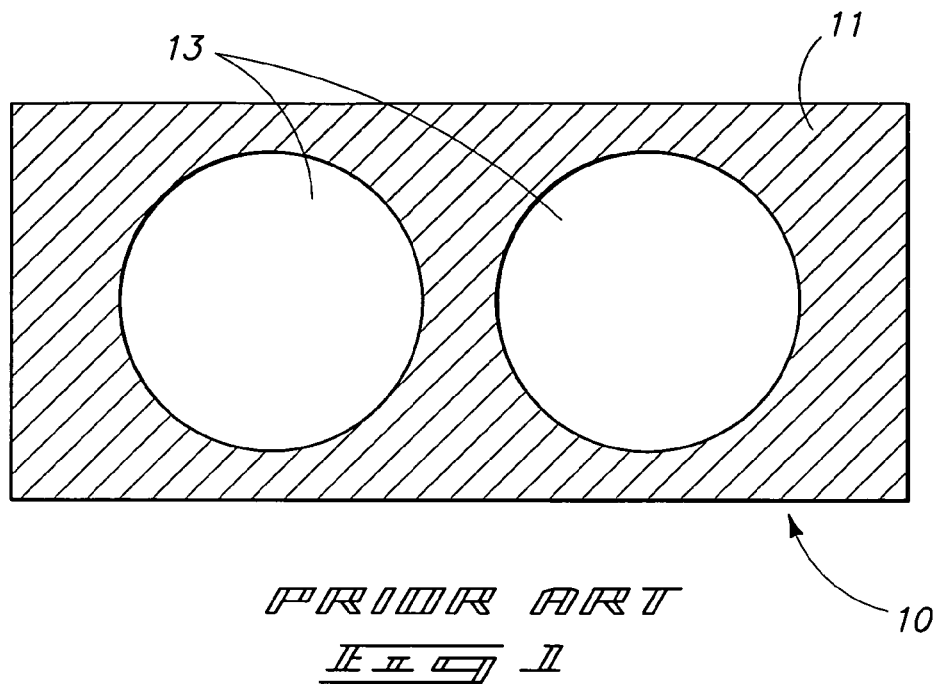
FIG. 1 is a fragmentary, greatly simplified, schematic diagram of a prior art batch processing system.
Figure 2:
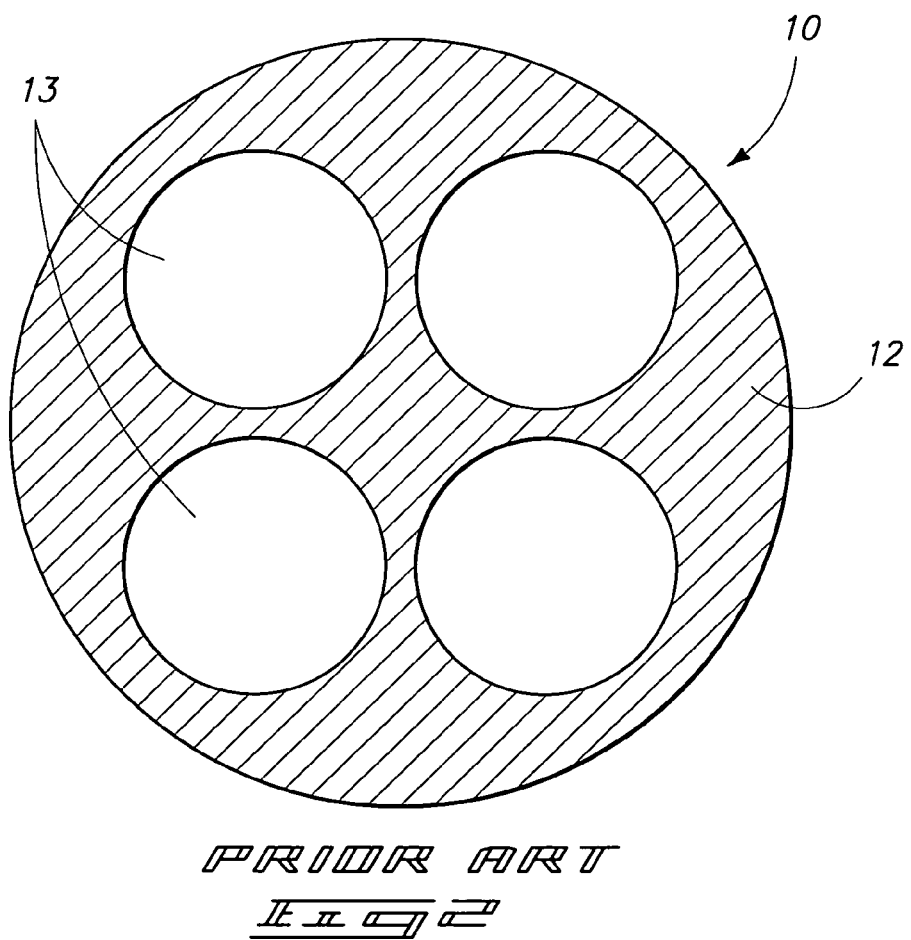
FIG. 2 is a greatly simplified, fragmentary, schematic view of another prior art batch processing system.
Figure 2:
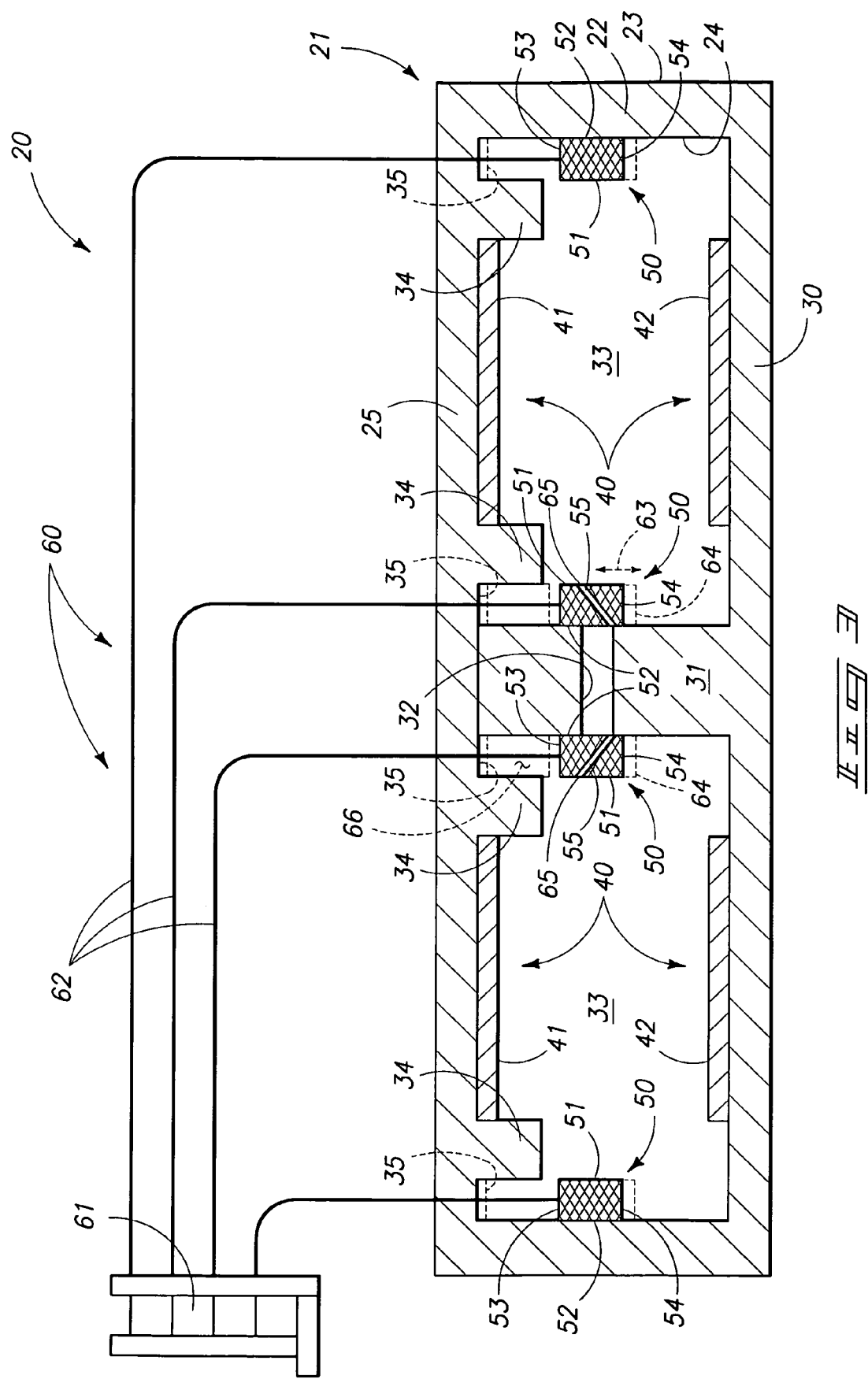

FIGS. 1 and 2 illustrate greatly simplified, fragmentary views of two prior art batch processing arrangements which have been utilized heretofore. It will be understood from these figures that the prior art plasma processing apparatuses 10 have included a first form 11 (FIG. 1) and a second form 12 (FIG. 2). In the first form 11, the chamber has a generally rectangular shape, and in the second form 12, the chamber has a circular configuration. Within each of the prior art plasma processing apparatuses 10, a plurality of processing stations 13 have been provided. As seen in FIG. 1, at least two processing stations 13 are provided; and four processing stations are provided in the second form 12. Typically, these processing stations are round. Further, there are usually no dividing or separating walls located between the respective processing stations.

Referring now to FIG. 3, a first form of a plasma processing apparatus 20 is shown in a highly simplified, fragmentary, transverse, vertical sectional view. It will be seen that the first form of the plasma processing apparatus 20 has a plasma processing chamber which is generally indicated by the numeral 21, and which is defined by a substantially vertically oriented and continuous sidewall 22 which has an outside facing surface 23, and an opposite inside facing surface 24. Still further, and mounted on or made integral with the continuous sidewall 22, is a top surface 25, and an opposite bottom surface 30. As seen in FIG. 3, an interior wall 31 extends therebetween the top and bottom surfaces 25 and 30. An opening or channel 32 is formed in the interior wall. Additionally, it will be seen that the interior wall defines at least two processing stations which are generally indicated by the numeral 33. As illustrated in FIG. 3, a grounding ring 34 extends substantially normally downwardly relative to the top surface 25, and into the respective processing stations 33. As illustrated in FIG. 3, a gap 35 is defined between the respective grounding rings 34 and the adjacent interior wall 31 and sidewall 22. In the first form of the plasma processing apparatus 20, electrodes 40 are provided. The electrodes include a first or top electrode 41 which is mounted on the top surface 25 and is located within each of the respective processing stations 33. As seen in FIG. 3, the first or top electrode 41 is substantially surrounded by the grounding ring 34. Each processing chamber 21 further includes a second or bottom electrode 42 which is mounted on the bottom surface 30, and which is spaced from the first electrode 41. As will be appreciated from a study of FIG. 3, the opening or channel 32 couples the respective processing stations 33 in fluid flowing relation one relative to the other.

Figure 6:
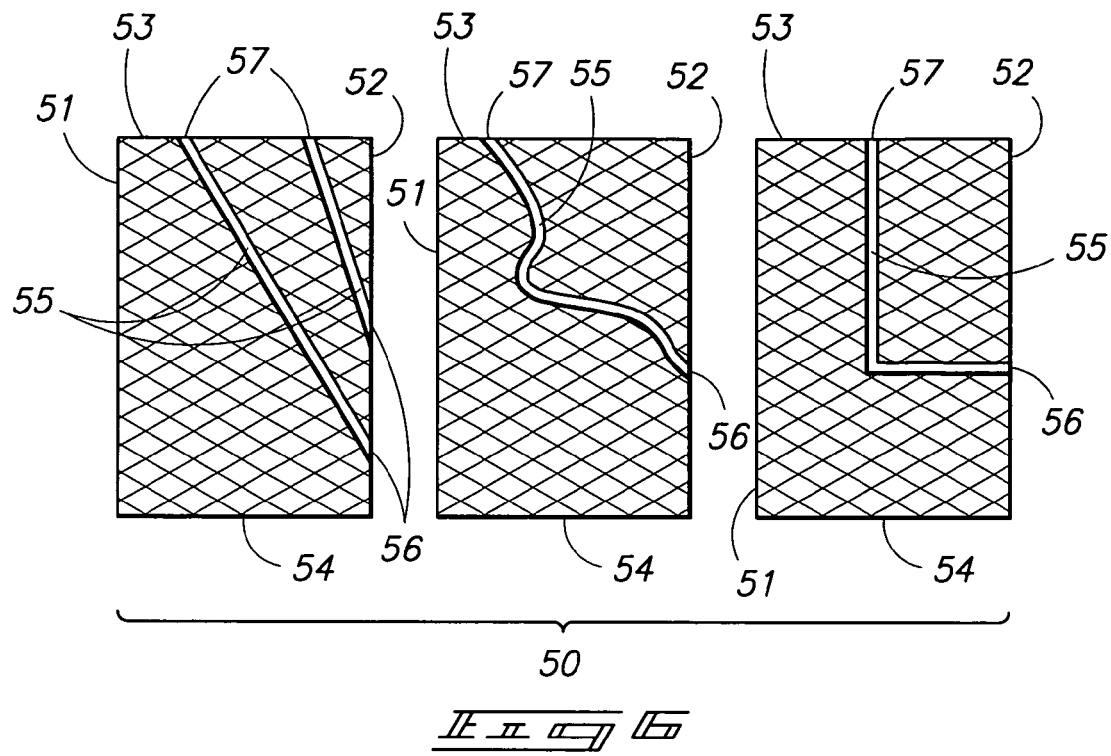
FIG. 6 is a greatly simplified, transverse, vertical sectional view of several forms of a protection assembly which is employed with the various forms of the plasma processing apparatus of the present invention.

Referring still to FIG. 3, it will be understood that in the first form of the present invention 20, a protection assembly which is generally indicated by the numeral 50, is provided. The protection assembly 50 (which may have several forms as seen in FIG. 6) is located within at least one of two processing stations 33, and is further selectively moveable along the interior wall 31 which separates the at least two processing stations 33 and the sidewall 22. The protection assembly 50 has an inside peripheral edge 51, and an outside peripheral edge 52. Typically, the protection assembly is a continuous ring. As illustrated in the drawing, the outside peripheral edge 52 is positioned in closely adjacent or in juxtaposed relation relative to the continuous sidewall 22 and the interior wall 31. The protection assembly further has a top surface 53 and a bottom surface 54. As seen most clearly by reference to FIG. 3 and FIG. 6, at least one channel 55, having width and length dimensions, is formed in the protection assembly 50 and is operable to selectively couple the respective processing stations 33 in fluid flowing relation one relative to the other. The channel 55 has a first end 57 which is located adjacent to the respective processing stations 33, and an opposite second end 56 which may be moved into fluid flowing communication relative to the opening or channel 32 which is formed in the interior wall 31.

Figure 9:
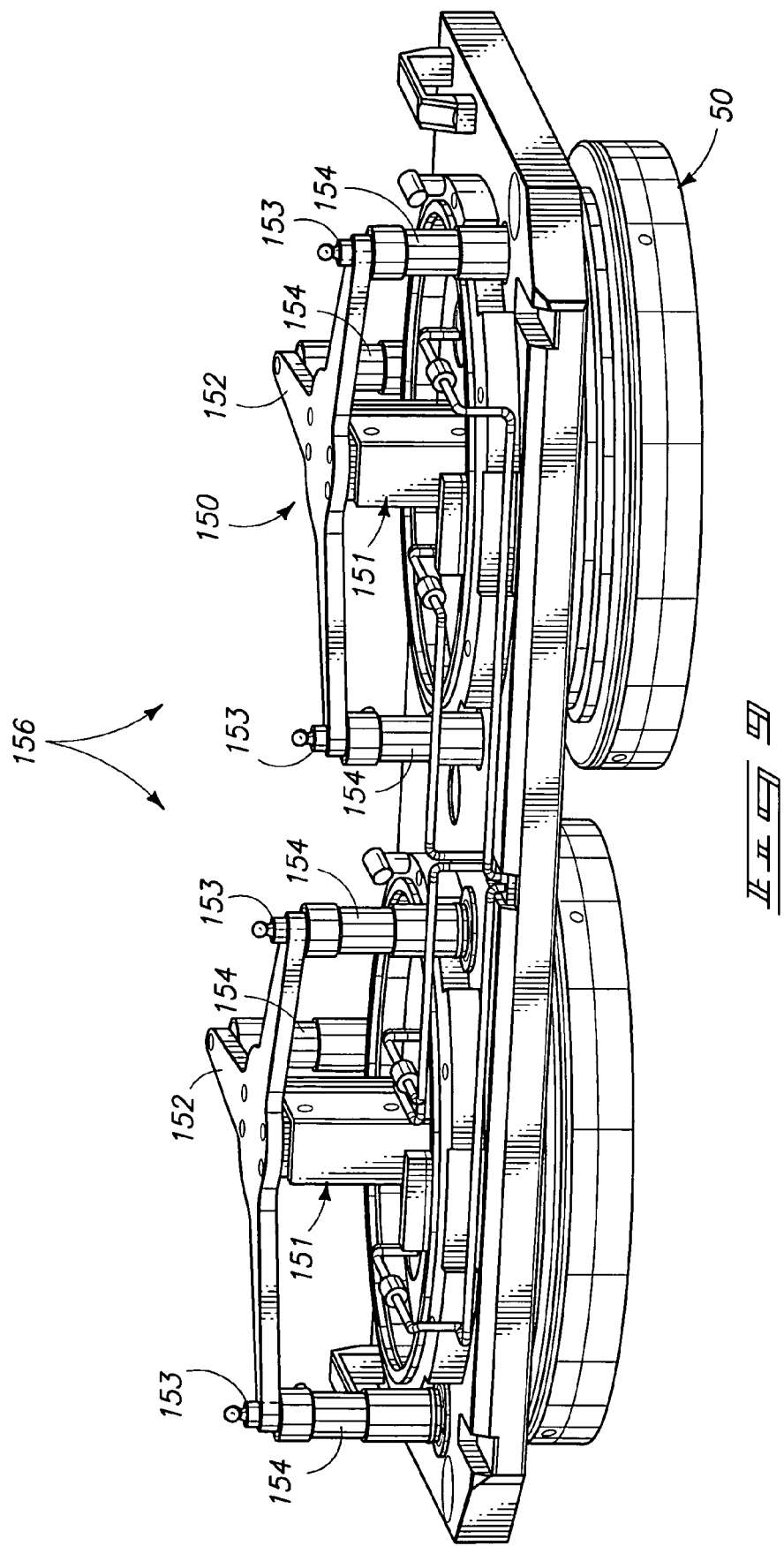
FIG. 9 is a fragmentary, perspective, side elevation view of a protection assembly mounted on the chamber lid of a plasma processing apparatus of the present invention.

In the first form of the invention 20 as seen in FIG. 3, the invention 20 includes a drive assembly which is generally indicated by the numeral 60. The drive assembly typically includes a motor 61, which is coupled in force transmitting relation relative to a drive linkage, and which is generally indicated by the numeral 62. The drive linkage may include a direct drive member as will be described hereinafter, or may merely include cables as graphically depicted herein, and which are utilized in the form of the invention as seen in FIG. 9, and which will be discussed hereinafter. The drive assembly, and more specifically, one end of the drive linkage 62, is mounted to the top surface 53 of the protection assembly 50, as illustrated, and is operable to impart force to the protection assembly so as move the protection assembly along a path of travel which is generally indicated by the numeral 63. The motor 61 is operable to move the protection assembly from a first position 64 (which is indicated in phantom lines), and where the protection assembly 50 substantially blocks or occludes the opening 32; to a second position 65 where the channel 55 is now coupling the respective processing stations 33 in fluid flowing relation one relative to the other. Still further, the drive assembly 60 is operable to move the protection assembly 50 to a third position 66, and where it is received, at least in part, within the gap 35 which is defined therebetween the grounding ring 34 and the sidewall 22. When located in the third position 66, the opening 32 is non-occluded. The protection assembly 50 defines a channel 55 which extends therethrough and which has a width to length ratio of less than about 1:3. In the arrangement as shown, the channel 55 insures the movement of neutral particles between the processing stations 33, and further facilitates the balance of gas pressure between the respective processing stations 33. However, the dimensional relationship of the channel 55 insures that most charged particles that will attempt to move between the respective processing stations 33 will collide with the wall of the channel 55, thus removing the electrical charge and avoiding the interference of charged particles between the respective processing stations 33. In the arrangement as seen, it will be understood that the motor 61 may include a plurality of internal gears which facilitate the movement of the protection assembly 50 between the first, second and third positions. Still further, and as best illustrated and understood by a study of FIG. 6, the channel 55 which is defined by the protection apparatus 50 may have a linear or non-linear shape to achieve the benefits of the present invention. As should be understood, the plasma processing apparatus 20 as described herein may be useful in various assemblies including plasma deposition equipment and plasma etching equipment.

Figure 4:
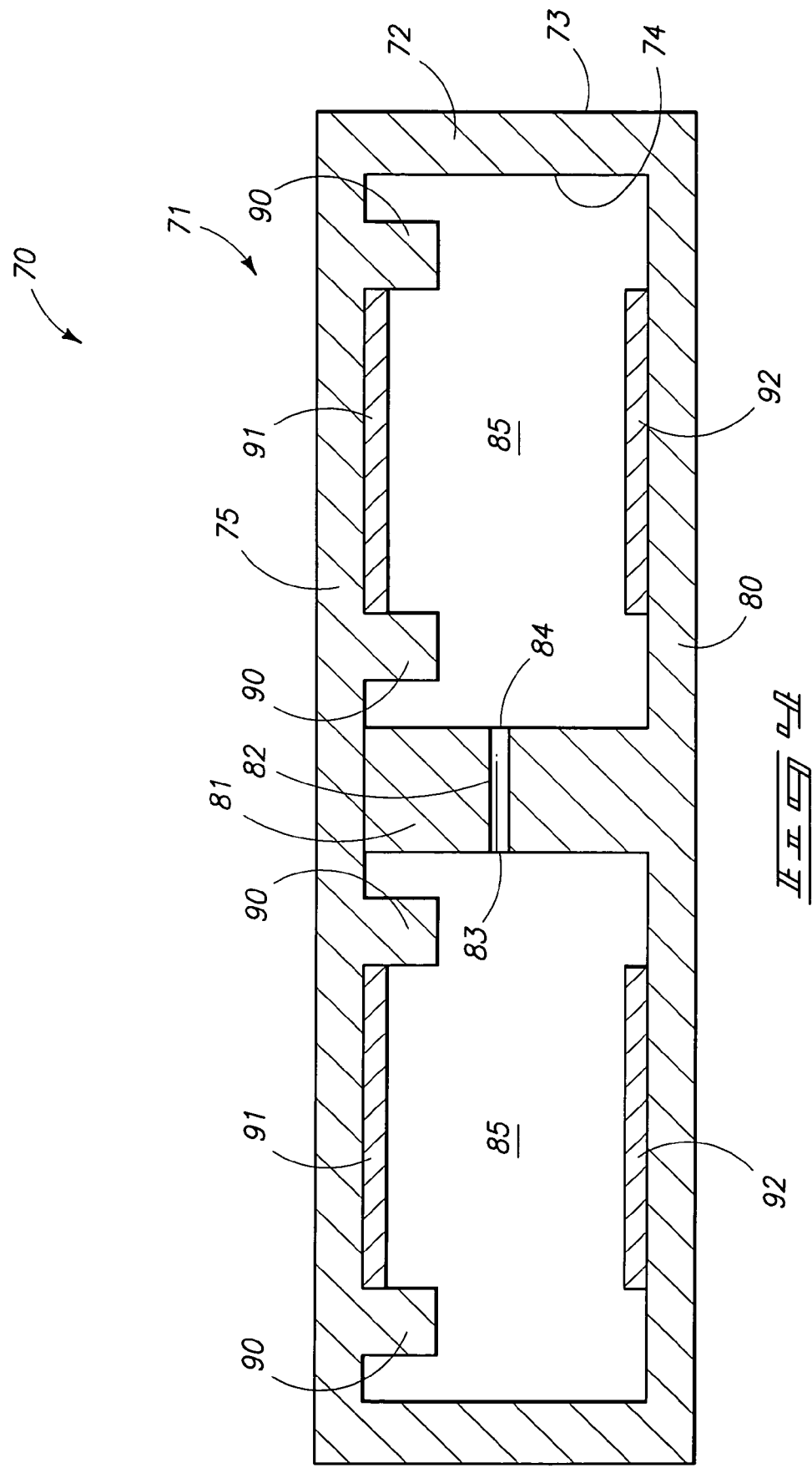
FIG. 4 is a greatly simplified, schematic diagram of a second embodiment of the plasma processing apparatus of the present invention.

Referring now to FIG. 4, a second form of the present invention is generally indicated by the numeral 70 therein. A plasma processing apparatus of the present invention is provided, and which includes a plasma processing chamber which is generally indicated by the numeral 71. The plasma processing chamber is defined by a substantially continuous, and vertically disposed sidewall 72 which has an outside facing surface 73, and an inside facing surface 74. As was described with the first form of the invention 20, the plasma processing chamber has a top surface 75, and an opposite, bottom surface 80. In the second form of the invention 70, an interior wall 81 is provided, and which joins the top and bottom surfaces 75 and 80 together. The interior wall 81 further defines a channel 82 which has a first end 83, and an opposite second end 84. The interior wall 81 further defines at least two processing stations 85, and the channel 82 is operable to couple the processing stations 85 in fluid flowing relation one relative to the other. In the present form of the invention 70, the channel has a width to length ratio of less than about 1:3, and which provides the benefits of the present invention, and which further prevents the exchange of charged particles between the respective processing stations 85. As with the previous form of the invention 20, the channel 82 which is defined by the interior wall 81 may have a linear or non-linear shape. Further, the present form of the invention may be useful on plasma deposition equipment and plasma etching equipment. As with the first form of the invention, grounding rings 90 are individually mounted or made integral with the top surface 75, and are positioned within the respective processing stations 85. Still further, a first electrode 91 is surrounded by the respective grounding rings in each of the processing stations 85, and the second electrode 92 is mounted on the bottom surface 80 thereof.

Figure 5:
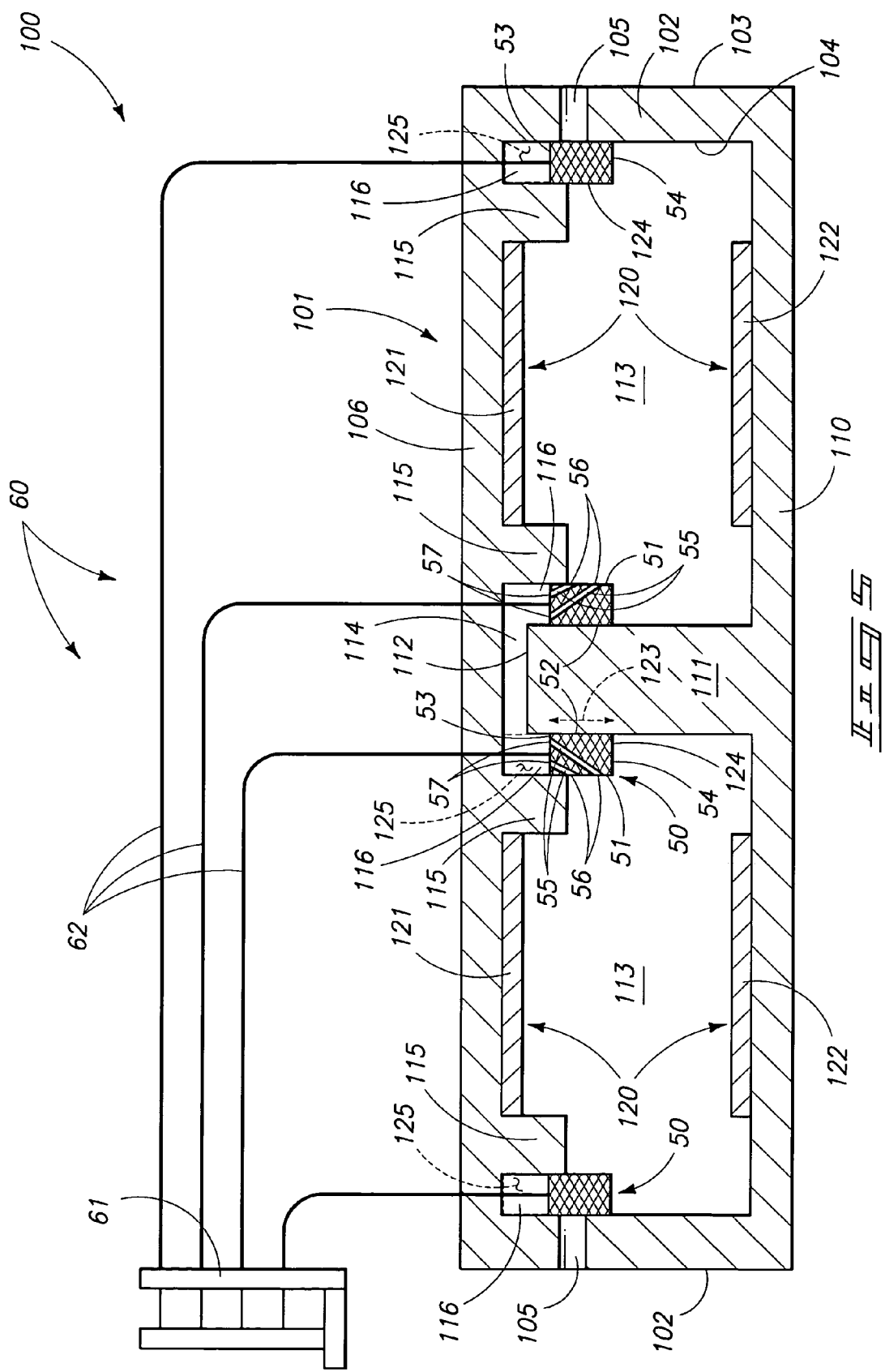
FIG. 5 is a greatly simplified, fragmentary, schematic diagram of a third embodiment of the plasma processing apparatus of the present invention.

Referring now to FIG. 5, a third form of the invention is generally indicated by the numeral 100 therein. As seen in FIG. 5, the third form of the invention 100 includes a plasma processing chamber which is generally indicated by the numeral 101. The plasma processing chamber is defined, in part, by a substantially vertically disposed sidewall 102. The sidewall is defined by an outside facing surface 103, and an opposite inside facing surface 104. As seen in FIG. 5, the sidewall 102 defines individual transfer ports 105 which facilitate the movement of a semiconductor work piece into, and out of, the respective processing stations which will be described, below. The plasma processing chamber 101 further has a top surface 106, and a bottom surface 110 which are individually affixed to the sidewall 102. In addition to the foregoing, the plasma processing chamber 101 has an interior wall 111 which is mounted on the bottom surface 110 and which further has a top peripheral edge 112 which is disposed in predetermined spaced relation relative to the top surface 106. The interior wall 111 defines at least two processing stations 113. Still further, an opening or passageway 114 is defined between the top surface 106 and the top peripheral edge 112. The opening or passageway 114 couples the respective processing stations 113 in fluid flowing relation one relative to the other. Extending normally, downwardly relative to the top surface 106 are individual grounding rings which are generally indicated by the numeral 115. As seen by reference to FIG. 5, individual gaps 116 are defined therebetween the sidewall 102, and the respective grounding rings 115; and the interior wall 111 and the individual grounding rings 115. As should be understood from studying FIG. 5, the opening or passageway 114 is located adjacent to the respective grounding rings 115, and is further coupled in fluid flowing relation relative to the gaps 116 which are defined between the respective grounding rings 115, and the interior wall 111. As illustrated in FIG. 5, electrodes 120 are provided. A first electrode 121 is positioned within each processing station 113 and is mounted on the top surface 106. The grounding ring 115 which is provided substantially surrounds same. Still further, a second electrode 122 is mounted on the bottom surface 110 and is positioned in spaced relation relative thereto.

Figure 7:
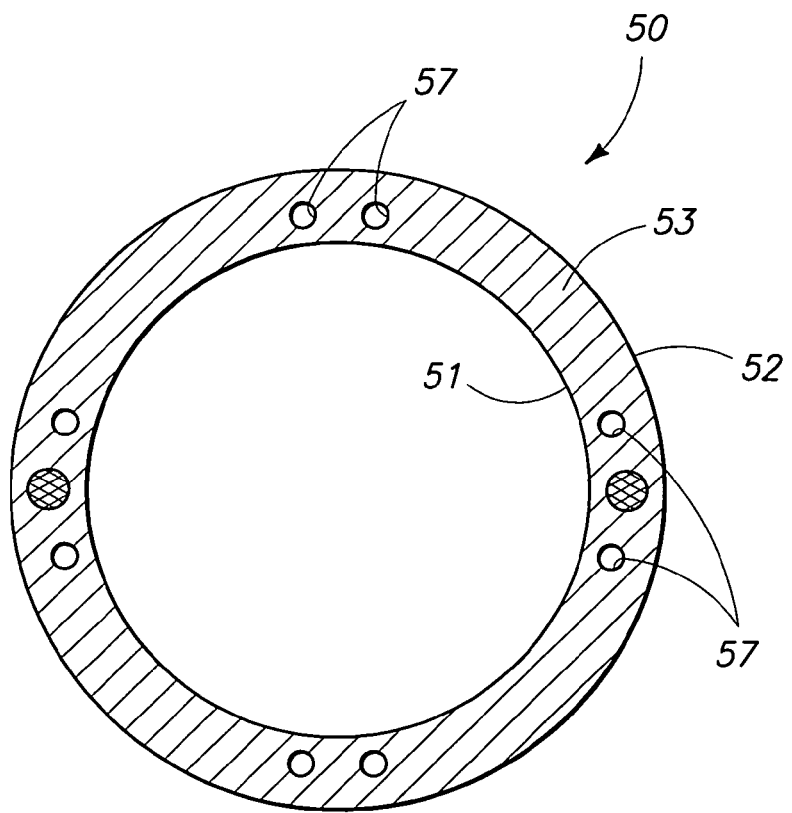
FIG. 7 is a greatly simplified, top plan view of a portion of a protection assembly which is employed with the various forms of the plasma processing apparatus of the present invention.

As seen in FIG. 5, it will be understood that the third form of the invention 100 includes a protection assembly 50 similar to that which was earlier described. The protection assembly is positioned within each of the processing stations 113. The protection assembly 50 is moveable relative to the interior wall 111, and the exterior sidewall 102 of the processing chamber 101, and within the gap 116 which is defined between each of the grounding rings 115 and the interior wall 111, and the exterior sidewall 102. As earlier discussed, the protection assembly 50 defines at least one channel 55 which has a width to length ratio of less than about 1:3. As seen in FIG. 5, two channels are formed therein, and which allow the passage of a reaction gas therebetween the respective processing stations 113. Similar to that which was earlier disclosed, the third form of the invention 100 includes a drive assembly generally indicated by the numeral 60, and which includes a motor 61 which is coupled in driving relation relative to a drive linkage which is generally indicated by the numeral 62. Again, with respect to this form of the invention, the protection assembly 50, as illustrated in FIG. 5, is moveable along a path of travel 123 from a first position 124, where the protection assembly 50 blocks the respective transfer ports 105 and further positions the channel 55 in an orientation where it couples the respective processing station 113 in fluid flowing relation one relative to the other. As earlier described, the channel 55 has a width to length ratio of less than about 1:3. As should be understood from a study of FIG. 5, the protection assembly 50 when located in the first position 124 is located, at least in part, within the gaps 116 which are defined between the respective grounding rings 115, and the interior wall 111, and exterior wall 102, and the channel 55 couples the respective internal processing stations 113 in fluid flowing relation one relative to the other. Still further, when the protection assembly 50 is located in a second position 125 (shown in phantom lines), it is positioned substantially within the gap 116 which is defined between the respective grounding rings 115 and the interior and exterior sidewalls 111 and 102. Further, the channel 55 which is defined by the protection assembly 50 does not couple the respective processing stations 113 in fluid flowing relation one relative to the other. Further, the transfer ports are non-occluded thereby permitting semiconductor work pieces to move into and out of the processing stations 113. The protection assembly 50 which is employed with the third form of the invention as seen in FIG. 5 is best understood by study of FIG. 7. As with the previous forms of the invention, it should be understood that the motor 61 can be selectively controlled, and the drive linkage 62 may assume various forms. As was previously described, the motor 60 can include internal gears which facilitate the movement of the protection assembly 50 between the first and second positions 124 and 125, respectively. Still further, and as earlier described, the channel 55 formed in the protection assembly as provided in the third form of the invention 100 may have a linear or non-linear shape, and can assume various forms as seen in FIG. 6.

Figure 10:
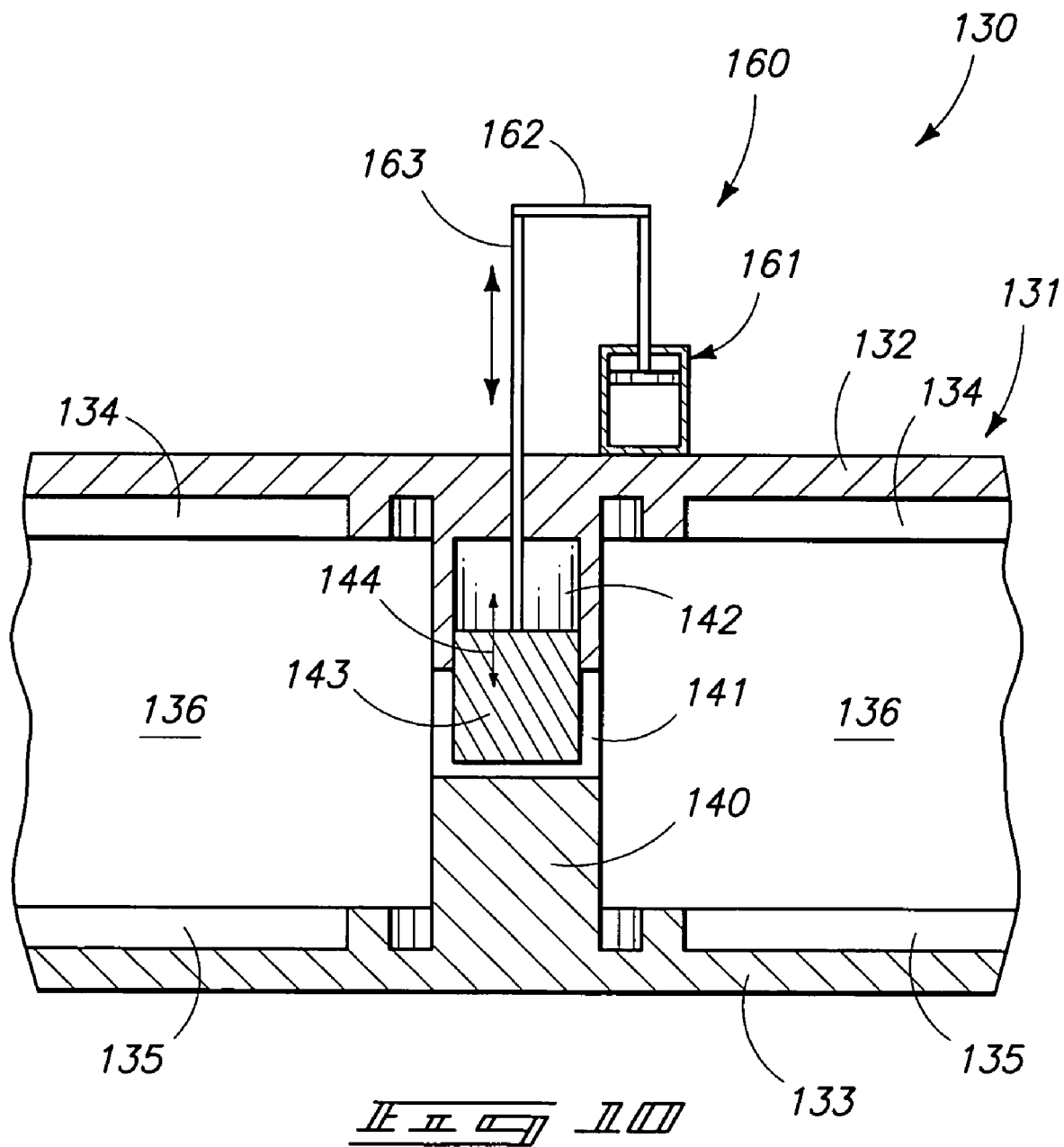
FIG. 10 is yet another fragmentary, transverse, vertical, sectional view of another form of a protection assembly mounted on a chamber lid of a plasma processing apparatus of the present invention.

Referring now to FIG. 10, a fourth form of the present invention is generally indicated by the numeral 130 therein. In this fragmentary, transverse, vertical sectional view, it will be understood that the fourth form of the invention 130 includes a plasma processing chamber which is generally indicated by the numeral 131, and which further has a top surface 132, and an opposite bottom surface 133. A first or top electrode 134 is mounted on the top surface, and an opposite, bottom electrode 135 is mounted on the bottom surface 133. The plasma processing chamber 131 further has at least two processing stations 136 which are separated by an interior wall 140 which joins the top and bottom surfaces 132 and 133 together. As seen in FIG. 10, the interior wall 140 defines an opening 141 which couples the respective processing stations 136 in fluid flowing relation one relative to the other. Still further, a substantially vertically disposed passageway 142 is formed internally of the interior wall and is operable to slideably receive a member 143, which is borne by the interior wall. The member 143 is selectively moveable so as to selectively occlude the opening 141, and thereby adjust the width to length ratio of the opening 141 to less than about 1:3. As seen in the drawing, the member 143 is moveable along a path of travel 144 by a drive assembly which is similar to that previously described. The moveable member 143 may be moved along the path of travel 144 from a first position where the member substantially occludes the opening; to a second position where the width to length ratio of the opening 141 is less than about 1:3. Similar to other forms of the invention, the opening 141 defined by the interior wall 140 may have a linear or non-linear shape. The fourth form of the invention 130 further includes a drive assembly which is generally indicated by the numeral 160. The drive assembly 160 generally includes a motor or cylinder 161 which may be energized so as to move the member 143 along the path of travel 144 to achieve the benefits earlier described. A gantry or support member 162 is borne by the motor or cylinder 161 and is moveable along a vertical path of travel. The gantry includes a drive linkage 163 which depends downwardly therefrom and which is coupled to the member 143 in order to drive it along the path of travel 144. The drive linkage may comprise a cable or a solid rod. The drive assembly 160 includes sealing assemblies (not shown) which slideably and sealingly receive the respective drive linkage 163. The sealing assembly is attached to the top surface 132 of the plasma processing chamber 131. The member 143 and associated drive assembly 160 may be fabricated into various forms depending upon the design of the processing chamber 130.

Figure 8:
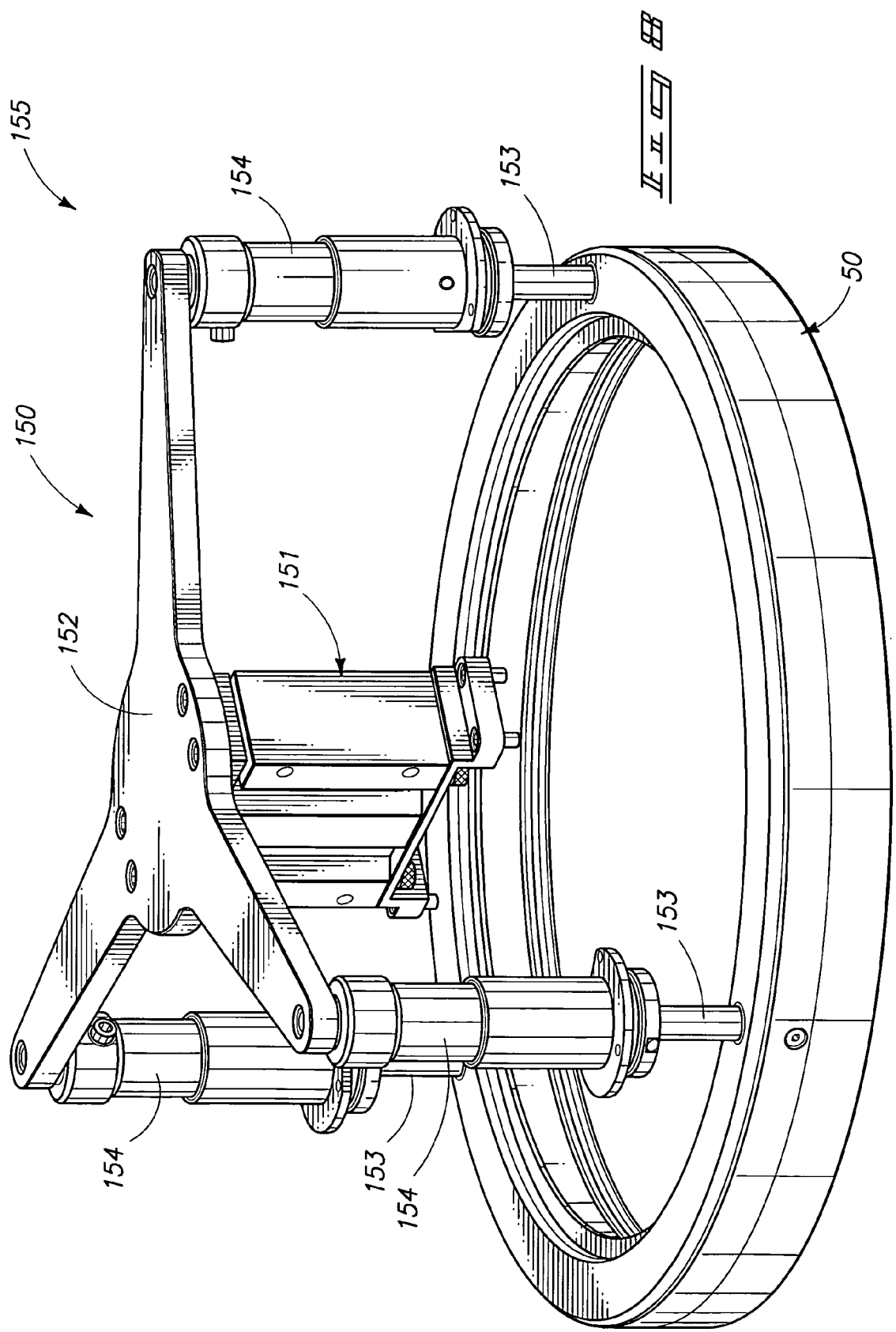
FIG. 8 is a fragmentary, perspective, side elevation view of one form of a protection assembly utilized in the present invention.

Referring now to FIGS. 8 and 9, two alternative forms of the earlier discussed protection assembly are illustrated. These two views also show two possible forms of the earlier described drive assembly 60. As seen in these two drawings, these forms of the drive assembly which are indicated by the numeral 150 each include a motor or cylinder 151 which may be energized so as to move the protection assembly 50 along the path of travel which was earlier described. The drive assembly 150 includes a gantry 152 which is affixed to the motor or drive cylinder 151, and which is moveable along a vertical path of travel. The drive assembly 150 includes a drive linkage 153 which is coupled to the gantry and which is further mounted to the protection assembly 50. The drive linkage may include a cable as utilized in the form of the invention as seen in FIG. 3, or a solid rod as best seen in FIG. 8. The drive assembly 150 includes sealing assemblies 154 which are operable to slideably and sealingly receive the drive linkage 153.

Operation

The operation of the described embodiments of the present invention are believed to be readily apparent and are briefly summarized at this point.

A first aspect of the present invention relates to a plasma processing apparatus 70 which includes a plasma processing chamber 71 defining at least two processing stations 85; and a wall 81 is positioned in the processing chamber and further separates the two processing stations. The wall defines a channel 82 which couples the two processing stations in fluid flowing relation. The channel 82 has a width to length ratio of less than about 1:3.

Another aspect of the present invention relates to a plasma processing apparatus 130 which includes a plasma processing chamber 131 defining at least two processing stations 136, and which are separated from each other by a wall 140. The wall 140 defines an opening 141 which couples the two processing stations 136 in fluid flowing relation one relative to the other. Still further, the plasma processing apparatus 130 includes a member 143 which is borne by the wall 140, and which is selectively moveable so as to selectively occlude the opening 141 so as to adjust a width to length ratio of the opening to less than about 1:3.

Another aspect of the present invention relates to a plasma processing apparatus 20 which includes at least one plasma processing chamber 21, and which defines at least two processing stations or regions 33 which are respectively separated from each other by an interior wall 31. The interior wall defines an opening 32 which couples the respective processing regions in fluid flowing relation one relative to the other. The plasma processing apparatus 20 further includes a protection assembly 50 located within at least one of the two processing stations 33, and which is selectively moveable along the interior wall 31 which separates the at least two processing stations. The protection assembly 50 defines a channel 55 which extends therethrough, and which has a width to length ratio of less than about 1:3. As earlier discussed, this width to length ratio is effective to insure that charged species are not exchanged therebetween the respective processing stations 33 as earlier described.

Another aspect of the present invention relates to a plasma processing apparatus which is generally indicated by the numeral 100, and which includes a processing chamber 101 having an exterior sidewall 102, and an interior wall 111. The processing chamber further has top and bottom surfaces 106 and 110, respectively, and which are mounted on the exterior wall, and wherein the processing chamber 101, and interior wall 111 define at least two internal processing stations 113. The exterior sidewall 103 defines individual transfer ports 105 which facilitate the movement of a semiconductor work piece into, and out of, the respective processing stations 113. An opening 114 is defined between the top surface 106 of the processing chamber 101, and the interior wall 111. This opening couples the respective processing chambers 113 in fluid flowing relation, one relative to the other. The third form of the invention 100 further includes individual grounding rings 115 which are mounted on the top surface 106 of the processing chamber 101, and which are individually located within each of the processing stations 113. A gap 116 is defined between each of the grounding rings 115 and the interior wall 111; and the exterior wall 102; and the opening 114 is adjacent to each of the grounding rings 115. The third form of the invention 100 further includes a first electrode 121 mounted on the top surface 106 of the processing chamber 101, and within each of the processing stations 113. As illustrated in FIG. 5, the individual grounding rings 115 substantially surround each of the first electrodes 121. Still further, a second electrode 122 is mounted on the bottom surface 110 of the processing chamber 101, and which is further positioned within each of the processing stations 113. In the arrangement as shown in FIG. 5, a protection assembly 50 is provided and positioned within each of the processing stations 113, and moveable relative to the interior 111 and exterior walls 102 of the processing chamber 101, and within the gap 116 defined between each of the grounding rings 115 and the interior wall 111. The protection assembly is moveable from a first position 124, wherein the protection assembly blocks the respective transfer ports 105, to a second position 125 where the respective transfer ports are open. Still further, the protection assembly further defines a channel 55 which selectively couples the respective processing stations in fluid flowing relation, one relative to the other, and wherein the channel has a width to length ratio of less than about 1:3.

Therefore, it will be seen that the plasma processing apparatus of the present invention provides a convenient means whereby the problems associated with the prior art devices and practices can be substantially eliminated. Still further, the plasma processing apparatus may be used on both plasma deposition equipment as well as plasma etching equipment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A plasma processing apparatus, comprising:
a processing chamber having a side wall, an interior wall, and top and bottom surfaces which are mounted on the side wall, and wherein the processing chamber and interior wall define at least two internal processing stations, and wherein the side wall defines individual transfer ports which facilitate the movement of a semiconductor work piece into, and out of, the respective processing stations, and wherein an opening is defined between the top surface of the processing chamber, and the interior wall, and which couples the respective processing stations in fluid flowing relation, one relative to the other;
two grounding rings wherein each grounding ring is mounted on the top surface of the processing chamber, and within each of the processing stations, and wherein a gap is defined between each of the grounding rings and the interior wall, and the opening is adjacent to each of the grounding rings;
two first electrodes wherein each first electrode is mounted on the top surface of the processing chamber, and within each of the processing stations, and wherein the grounding ring surrounds the respective first electrodes;
two second electrodes wherein each second electrode is mounted on the bottom surface of the processing chamber, and within each of the processing stations;
a protection assembly positioned within each of the processing stations, and moveable relative to the interior and side walls of the processing chamber and within the gap defined between each of the grounding rings and the interior wall from a first position, wherein the protection assembly blocks the respective transfer ports, to a second position where the respective transfer ports are open, and wherein the protection assembly further defines a channel which selectively couples the respective processing stations in fluid flowing relation, one relative to the other.

2. A plasma processing apparatus as claimed in claim 1, wherein the opening has a width to length ratio of less than about 1:3.

3. A plasma processing apparatus as claimed in claim 1, and wherein the opening defined by the wall has a linear or nonlinear shape, and wherein the plasma processing apparatus is selected from the group comprising plasma deposition equipment, and plasma etching equipment.

4. A plasma processing apparatus as claimed in claim 1, and wherein the drive assembly moves the protection assembly along a course of travel from a first position where the protection assembly is positioned in covering relation relative to the opening, and the channel defined by the protection assembly is not oriented in fluid flowing relation relative to the opening; and a second position where the protection assembly is positioned in covering relation relative to the opening, and the channel defined by the protection assembly is oriented in fluid flowing relation relative to the opening.

5. A plasma processing apparatus as claimed in claim 1, and further comprising a drive assembly coupled in force transmitting relation relative to the protection assembly and which is operable to move the protection assembly between the first and second positions.

6. A plasma processing apparatus as claimed in claim 1, and wherein the drive assembly moves the protection assembly along a course of travel from the first position where the protection assembly blocks the respective transfer ports, to the second position where the respective transfer ports are open, and wherein the protection assembly when located in the first position, is located, at least in part, within the gap which is defined between the respective grounding rings and the interior wall, and wherein the channel defined by the protection assembly couples the respective internal processing stations in fluid flowing relation, one relative to the other, and wherein the protection assembly when located in the second position is positioned substantially within the gap which is defined between the respective grounding rings and the interior wall, and the channel defined by the protection assembly does not couple the respective processing stations in fluid flowing relation one relative to the other.

7. A plasma processing apparatus as claimed in claim 6, and wherein the drive assembly comprises a motor which can be selectively controlled, and a drive linkage which is coupled the protection assembly and disposed in force receiving relation relative to the motor.

8. A plasma processing apparatus as claimed in claim 7, and wherein the motor has internal gears which facilitate the movement of the protection assembly between the first and second positions.

9. A plasma processing apparatus as claimed in claim 1, and wherein the channel which is defined by the protection assembly has a linear or nonlinear shape.

10. A plasma processing apparatus as claimed in claim 1, and wherein the plasma processing apparatus is selected from the group comprising plasma deposition equipment, and plasma etching equipment.

* * * * *